United States Patent
Misawa et al.

(10) Patent No.: US 7,595,845 B2
(45) Date of Patent: Sep. 29, 2009

(54) TELEVISION SWITCH MODULE

(75) Inventors: Atsushi Misawa, Ise (JP); Masakazu Nishikawa, Watarai-gun (JP); Kaori Yagata, Ise (JP); Mamoru Tateishi, Suwa-gun (JP)

(73) Assignees: Panasonic Electric Works Co., Ltd., Kadoma-Shi, Osaka (JP); Scitex Inc., Nagano (JP)

( * ) Notice: Subject to any disclaimer, the term of this patent is extended or adjusted under 35 U.S.C. 154(b) by 495 days.

(21) Appl. No.: 10/571,467

(22) PCT Filed: Apr. 21, 2005

(86) PCT No.: PCT/JP2005/007635

§ 371 (c)(1),
(2), (4) Date: Mar. 13, 2006

(87) PCT Pub. No.: WO2005/104350

PCT Pub. Date: Nov. 3, 2005

(65) Prior Publication Data

US 2008/0252792 A1   Oct. 16, 2008

(51) Int. Cl.
H04N 5/63 (2006.01)
(52) U.S. Cl. .................................. 348/730; 348/705
(58) Field of Classification Search .......... 348/705, 348/706, 731, 725, 730, 554, 555; 455/151.1, 455/153.1, 153.2
See application file for complete search history.

(56) References Cited

U.S. PATENT DOCUMENTS 4,672,687 A * 6/1987 Horton et al. ............ 455/150.1

5,301,352 A * 4/1994 Nakagawa et al. ............ 725/71
5,959,592 A * 9/1999 Petruzzelli .................. 725/68
6,832,071 B1 * 12/2004 Nakamura et al. ......... 455/3.02
7,136,618 B2 * 11/2006 Kato et al. ................. 455/3.02
2002/0193067 A1    12/2002 Cowley et al.

FOREIGN PATENT DOCUMENTS

| EP | 0718965 | 6/1996 |
| JP | 44-24968 | 10/1969 |
| JP | 04-105490 | 4/1992 |
| JP | 07-015715 | 1/1995 |
| JP | 08-340219 | 12/1996 |

(Continued)

OTHER PUBLICATIONS

English language Abstract of JP 04-105490.
English language Abstract of JP 07-015715.
English language Abstract of JP 08-340219.
English language Abstract of JP 10-070419.
English language Abstract of JP 2004-015224.

(Continued)

*Primary Examiner*—M. Lee
(74) *Attorney, Agent, or Firm*—Greenblum & Bernstein P.L.C.

(57) ABSTRACT

A television switch module for switching output lines of television high frequency signals, comprising: first and second input lines for respectively inputting television high frequency signals; first and second amplifiers for respectively amplifying input signals; first and second output lines for outputting the signals after amplified; a branching unit for branching an input signal; a relay switch for switching the signal lines; a relay switch control means for operation to switch the relay switch; and a power supply control means for controlling power supply to the respective amplifiers, and for stopping the power supply to an amplifier inserted in an unused input line. This makes it possible to operate only a necessary amplifier, and to reduce power consumption.

5 Claims, 10 Drawing Sheets

| | FOREIGN PATENT DOCUMENTS | |
|---|---|---|
| JP | 10-070419 | 3/1998 |
| JP | 11-004357 | 1/1999 |
| JP | 2003-008460 | 1/2003 |
| JP | 2003-046399 | 2/2003 |
| JP | 2004-015224 | 1/2004 |
| JP | 2004-336462 A | 11/2004 |
| WO | 2004/071080 | 8/2004 |

OTHER PUBLICATIONS

English language Abstract of JP 2003-008460.
English language Abstract of JP 2003-046399.
English language Abstract of JP 11-004357.
English language Abstract of JP 2004-336462 A, Nov. 25, 2004.

* cited by examiner

TELEVISION SWITCH MODULE

TECHNICAL FIELD

The present invention relates to a television module installed in a television receiver, and more particularly to a technology to reduce and stabilize its power consumption.

BACKGROUND ART

Conventionally, a television switch module is known which switches and outputs multiple line input signals of e.g. CATV (Cable Television) and terrestrial (Air) TV to specified output terminals (refer to e.g. Japanese Laid-open Patent Publication Hei 7-15715). Generally, this kind of television switch module has a built-in amplifier for amplifying signals, but the above-described patent publication does not describe power control of the amplifier.

A television switch module with a built-in amplifier of this kind is shown in FIG. 11, and will be described hereinafter. This television switch module comprises: two input lines 11, 21 (INPUT 1, INPUT 2) to which television high frequency signals are respectively input; amplifiers 12, 22 (AMP 1, AMP 2) for amplifying input signals; branching units 13, 23 for branching the input signals; two relay switches 16, 26 (SW 1, SW 2) subsequently connected for optionally selecting and switching signal output lines; two output lines 17, 27 (OUTPUT 1, OUTPUT 2); and a power supply/control interface 30 for operation to switch the relay switches 16, 26 and for providing power supply to the amplifiers 12, 22. The relay switches 16, 26 have relay switch contacts and a relay common contact to which lines 14, 15 and 24, 25 following the branching by the branching units 13, 23 are respectively connected. The common contacts are connected to the respective output lines 17, 27. Reference numeral 31 is a relay control line, and reference numeral 32 is a power supply line to the amplifiers 12, 22.

This television switch module enables the two input lines 11, 21 to be selectively switched and output to the two output lines 17, 27 by selecting four kinds of combinations using the relay switches 16, 26. For example, in the case of outputting a signal of the input line 11 to the output line 17, a high frequency input signal is output via the amplifier 12 and the relay switch 16 to the output line 17. Further, in the case of outputting a signal of the input line 21 to the output line 27, a high frequency input signal is output via the amplifier 22 and the relay switch 26 to the output line 27. In the case of outputting a signal of the input line 11 to the output line 27, a high frequency input signal is output via the amplifier 12 and the relay switch 26 to the output line 27. Further, in the case of outputting a signal of the input line 21 to the output line 17, a high frequency input signal is output via the amplifier 22 and the relay switch 16 to the output line 17. For these selected paths, high frequency signals are input to both amplifier 12 and amplifier 22.

On the other hand, in the case of outputting a signal of the input line 11 or the input line 21 to the two output lines 17, 27, a high frequency signal input from the input line 11 reaches the output lines 17 and 27 via the amplifier 13 and the relay switches 16 and 26, while a high frequency signal input from the input line 21 reaches the output lines 17 and 27 via the amplifier 23 and the relay switches 16 and 26. That is, in the case of outputting the input line 11 to the output lines 17 and 27, a high frequency signal is input to the amplifier 12, but no high frequency signal is input to the amplifier 22. Similarly, in the case of outputting the input line 21 to the output lines 17 and 27, a high frequency signal is input to the amplifier 22, but no high frequency signal is input to the amplifier 12.

As described above, in the case of providing two outputs from one input, power consumption can be reduced by operating only the amplifier to which a high frequency signal is input, namely by providing power supply only to the amplifier to which a high frequency signal is input.

However, in conventional configurations, power supply is always provided to both amplifiers, which means that they consume power more than necessary. Further, for current stabilization of an amplifying transistor, the conventional configurations generally use a method based on a resistance feedback circuit, which is insufficient in the current stability against e.g. variations or changes of the direct current amplification factor of the amplifying transistor. For this reason, the current of the amplifying transistor in some of them becomes larger than necessary, which has also been a cause of power consumption more than necessary.

Here, a specific example of the amplifiers 12, 22 is shown in FIG. 12. This amplifier circuit is an amplifier circuit using a transistor which is called a self-bias circuit. Since the current consumption of the amplifier circuit varies due to the variation of the current amplification factor hfe of the transistor, the self-bias circuit is devised so as to reduce its influence as much as possible.

The operation principle of this amplifier circuit will be described. The present circuit operates in a manner that when the collector current Ic increases, the voltage drop occurring across the resistance RL increases, which causes the base current IB flowing through the resistance RB to decrease, which causes the collector current Ic to decrease. Thus, the current consumption of the amplifier circuit can be expressed by the following equation:

$$Ic+IB=(hfe+1)\cdot(Vcc-VBE)/(RL+RB+hfe\cdot RL)$$

From this equation, it can be seen that it is possible to reduce the influence due to the variation of hfe by setting the resistance RL to be high, and the resistance RB to be low. However, actually, if the resistance RL is made high and the RB is made low to an extent to make negligible the current variation due to the variation of hfe, the voltage drop by the resistance RL becomes very large, which results in the use of the transistor in a very low range of the collector voltage, thereby preventing a dynamic range from being ensured. Thus, conventionally, there has been no other option than to allow the current variation to some extent in the operation.

Besides, it is known to add a current mirror circuit to an amplifier circuit so as to stabilize the current consumption even if hfe varies (refer to e.g. Japanese Laid-open Patent Publication Hei 10-70419). This circuit is configured to use a current mirror circuit to provide a bias current of a signal amplifying transistor. In the case of using the current mirror circuit, it is necessary to adjust the performances of a high frequency transistor and a bias transistor, particularly the base-emitter voltages. In order to achieve this, it is necessary to integrate all these transistors at close positions on a semiconductor. This is not a problem for an integrated circuit, but is not suitable for configuring a discrete circuit. Thus, there has been a demand to stabilize current consumption in a discrete circuit configuration with high design freedom.

DISCLOSURE OF INVENTION

Problem to be Solved by the Invention

The present invention is to solve the above problems, and it is an object of the present invention to provide a television switch module which operates only a necessary amplifier with a simple configuration, and can reduce power consumption. It is a further object of the present invention to provide a television switch module which can reduce the variation of current consumption of an amplifier circuit due to the variation of the current amplification factor of a transistor, while ensuring design freedom, by installing in the amplifier circuit a circuit for stabilizing its current consumption.

Means for Solving the Problem

To achieve the above objects, the present invention provides a television switch module for switching output lines of television high frequency signals, comprising: first and second input lines for respectively inputting television high frequency signals; first and second output lines for outputting signals which are the signals after amplified; first and second amplifiers inserted in the respective input lines for respectively amplifying input signals; a branching unit disposed in at least one line at an input or an output of the first or the second amplifier for branching the input line; a relay switch disposed in a further line different from the one line with the branching unit for switching either to the one line with the branching unit or to the further line branched by the branching unit; a relay switch control means for operation to switch the relay switch based on operation from outside; and a power supply control means for controlling power supply to the respective amplifiers, and for stopping the power supply to an amplifier inserted in an unused input line.

According to the present invention, in the case of outputting a signal input to either one of the input lines to two output lines, the power supply is provided to both amplifiers. However, in the case of outputting a signal input to either one of the input lines to one output line, the power supply is provided only to an amplifier which needs to be provided with power supply, while no power supply is provided to an amplifier inserted in the other line. Thus, the power consumption of the television switch module can be reduced.

Further, if power supply to an amplifier is superimposed on a line through which a high frequency signal passes via a relay switch, it is possible to use the power supply switch for the amplifier also as a switch of the high frequency path, and to omit complex wiring of control signal lines, thereby enabling cost reduction. Further, if an active current stabilizing circuit is added, the current consumption becomes substantially constant. Furthermore, by superimposing and separating DC current on and from a high frequency relay circuit so as to provide power supply to the amplifier, it is possible to simplify a circuit configuration for stopping current supply to an amplifier which is not necessary for operation.

Further, by the provision of the current stabilizing circuit in the amplifier, constant power consumption can be achieved without concern about the variation of hfe of transistor. This makes it possible to reduce a maximum power consumption value as compared with a conventional circuit. Furthermore, the above-described effect can be achieved in a discrete circuit configuration with high design freedom. In addition, the current stabilizing circuit operates to allow collector voltage Vc of a signal amplifying transistor to be a reference voltage. Accordingly, if the resistance value of a load resistance is set as a highly accurate one (generally, variation is small), the current flowing through the load resistance becomes substantially constant, making it possible to achieve constant power consumption.

According to a feature of the present invention, furthermore, the branching unit is formed of one unit disposed in the line at the input of the first amplifier. The relay switch is formed of one switch disposed in the line at the input of the second amplifier, and has relay switch contacts, to which one branch line by the branching unit and the other line are respectively connected, and also has a relay common contact, in which this common contact is connected to the line at the input of the second amplifier. The power supply control means continuously provides the power supply to the first amplifier while providing the power supply to the second amplifier by way of a standby circuit. And, the standby circuit provides the power supply to the second amplifier when a power supply switch of a television being turned ON, and stops the power supply during standby in the other time. This makes it possible that the power consumption of the television switch module is reduced, and that when, for example, a television signal containing character information in its out-of-band region is input to the first input line, the output line of the first amplifier can output the character information even during standby.

BEST MODE FOR CARRYING OUT THE INVENTION

Hereinafter, television switch modules (hereafter referred to as RF modules) according to embodiments of the present invention will be described with reference to the drawings.

First Embodiment

FIG. 1 shows a block configuration of an RF module according to First Embodiment, while FIG. 2 shows a circuit of the same RF module. The RF module 101 is built in a television, and has a first input terminal INPUT 1 and a second input terminal INPUT 2 for respectively inputting television high frequency signals as well as a first output terminal OUTPUT 1 and a second output terminal OUTPUT 2 for outputting the same signals. A CATV cable, for example, is connected to the first input terminal INPUT 1, and a terrestrial (Air) antenna cable is connected to the second input terminal INPUT 2. It is necessary to provide a space of a predetermined distance for isolation between the first input terminal INPUT 1 and the second input terminal INPUT 2. Tuners 51, 52 are respectively connected to the first output terminal OUTPUT 1 and the second output terminal OUTPUT 2.

The RF module 101 comprises: a first input line 11 connected to the first input terminal INPUT 1 and a second input line 21 connected to the second input terminal INPUT 2; a first output line 17 connected to the first output terminal OUTPUT 1 and a second output line 27 connected to the second output terminal OUTPUT 2; a first amplifier 12 (AMP 1) and a second amplifier 22 (AMP 2) respectively inserted in the input lines 11, 21 for respectively amplifying signals input to the respective input lines 11, 21; branching units 13, 23 for branching the respective amplifier output signals; and a first relay switch 16 (SW 1) and a second relay switch 26 (SW 2) for switching output lines. Furthermore, the RF module 101 comprises a power supply/control interface 30 (relay switch control means/power supply control means) as well as a power supply switch 33 (SW 3) and a power supply switch 34 (SW 4) for respectively turning on and off a power supply line 32 to the first and second amplifiers 12, 22.

The first and second relay switches 16, 26 are mechanical on/off switches using relays (RELAY). Branch lines 14, 15 of the branching unit 13 and branch lines 24, 25 of the branching unit 23 are respectively connected to the respective relay (RELAY) switch contacts of the two relay switches 16, 26, while the common contacts of the respective relays are respectively made to be the first output line 17 and the second output line 27. Here, the branch lines 15, 25 of the respective branching units 13, 23 cross each other and are connected to the respective other lines. A relay control signal line 31 is a control signal line to the first and second relay switches 16, 26. The power supply line 32 for power supply is connected to the amplifiers 12, 22. The power supply switch 33 and the power supply switch 34 are turned on and off by on/off control signals which are transferred by power supply control signal lines 35, 36.

The power supply/switch control interface 30 provides power supply to a necessary amplifier, but does not provide power supply to an unused amplifier, i.e. serves to stop the power supply thereto. Thus, for allowing a signal input to the first input line 11 to be output to the first and second output lines 17, 27, only the third switch 33 is to be turned on. Further, for allowing a signal input to the second input line 21 to be output similarly to the first and second output lines 17, 27, only the fourth switch 34 is to be turned on.

As such, one of the features of the present invention is the provision of the power supply switches 34, 34 for the amplifiers 12, 22 that perform operations coupled to the relay switches 16, 26 which determine the combinations of inputs and outputs.

A specific operation of the above-described circuit configuration will be described next. In the case of outputting an input to the first input line 11 to the first output line 17, and outputting an input to the second input line 21 to the second output line 27, the power supply switches 33, 34 are both turned to the ON-state to provide power supply to the amplifiers 12, 22. Similarly, for outputting an input to the first input line 11 to the second output line 27, and outputting an input to the second input line 21 to the first output line 17, the power supply switches 33, 34 are both turned to the ON-state to provide power supply to the amplifiers 12, 22. However, in the case of outputting an input to the first input line 11 to the first and second output lines 17, 27, only the power supply switch 33 is turned ON. Further, in the case of outputting an input to the second input line 21 to the first and second output lines 17, 27, only the power supply switch 34 is to be turned ON. The RF module according to the present configuration enables operation with minimum required power consumption.

Second Embodiment

FIG. 3 shows an RF module according to Second Embodiment. This RF module is configured such that the functions of the power supply switches 33, 34 for the amplifiers in the above First Embodiment are covered by the relay switches 16, 26, which are mechanical on/off switches, namely allowing them to also serve as switches of high frequency paths. More specifically, it is designed so that power supply to first and second amplifiers 12, 22 is superimposed by a power supply line 32 with high frequency on output lines 17, 27, through which high frequency signals pass, and is provided via relay switches 16, 26.

The point of this Embodiment is to superimpose power supply on high frequency signal lines, and can be practiced in the case where the relay switches 16, 26 are mechanical relays. In the case of mechanical relays, it is possible to pass therethrough the high frequency signals with, additionally, power supply to be provided to the respective amplifiers 12, 22 being superimposed, so that the power supply superimposed on the high frequency signal lines is provided to the amplifiers 12, 22 via the relay switches 16, 26.

This Embodiment, similarly as in the case of the above-described First Embodiment, enables operation with minimum required power consumption. Further, it does not require preparation of power supply switches (33, 34 in the First Embodiment), nor require control signal lines (35, 36 in the First Embodiment), so that it is possible to achieve cost reduction of power supply switches, and simplification of layout due to reduction of wiring.

FIG. 4 shows one example of a circuit of the amplifiers 12, 22 used in the above-described First and Second Embodiments. This amplifier circuit makes it possible to stabilize current consumption, regardless of variation of the current amplification factor of a signal amplifying transistor Tr. The base of the transistor Tr is an input terminal RFin of the amplifier circuit, with the collector being an output terminal RFout, while an active current stabilizing circuit is connected between the collector and the base of the transistor Tr. The current stabilizing circuit has Vcc as a power supply and includes transistors Tr1, Tr2, voltage dividing resistances R1, R2 for generating a reference voltage Vref, and so on. The reference voltage Vref is applied to the base of the transistor Tr2, and the emitter of the transistor Tr1 is connected to the collector (collector voltage Vc) of the transistor Tr, while the collector of the transistor Tr1 is connected to the base of the signal amplifying transistor Tr through a resistance RB.

The operation principle of this current stabilizing circuit will be described. The collector voltage Vc of the signal amplifying transistor Tr can be expressed as Vc=V'ref+Vbe1, where the base voltage of the transistor Tr1 is assumed to be reference voltage V'ref. Further, the base voltage V'ref of the transistor Tr1 can be expressed as V'ref=Vref−Vbe2 (where the base voltage of the transistor Tr2 is Vref). Assuming here that the transistors Tr1 and Tr2 are a transistor unit of two integrated transistors with Vbe1 being infinitely close to Vbe2:

$$Vc=V'ref+Vbe1=Vref-Vbe2+Vbe1=Vref$$

The reference voltage Vref is determined by the accuracies of the resistances R1 and R2.

Accordingly, if the resistance values of the resistances RL and R1, R2 are set as highly accurate ones (generally, variations are small), this current stabilizing circuit operates to allow the collector voltage Vc of the signal amplifying transistor Tr to be the reference voltage Vref. Thus, the current (IC+IB) flowing through the resistance RL becomes substantially constant, and as a result, the current of the transistor of the amplifier to be operated can be set at a required minimum, making it possible to prevent the power consumption from unnecessarily increasing due to the variations.

As for the active current stabilizing circuit, one of an emitter current detection type can be used. Its example is shown in FIG. 5. This current stabilizing circuit detects the emitter current of the signal amplifying transistor Tr so as to control the current to be constant, and has transistors Tr3, Tr4 and diodes D1, D2. Here, the base voltage VB of the transistor Tr3 is equal to VD+Vref, whereby the emitter voltage VE (=VB−VD) of the signal amplifying transistor Tr has an approximate value of Vref, and the emitter current IE has an approximate value of Vref/RE, which is a constant value.

FIG. 6 shows a circuit of a configuration of the embodiment of FIG. 3 having an amplifier circuit of FIG. 4 specifically disposed therein. Here, an amplifier 22 (AMP 2) is shown in detail, while a detailed showing of an amplifier 21 (AMP 1) is omitted. The power supply provided via the relay switches 16, 26 is separated from the high frequency line by way of a series inductance L component of a bias tee 40 to pass a DC component, so as to be provided to the amplifier 22 (AMP 2). By superimposing and separating the DC current on and from a high frequency relay circuit so as to provide power supply to the amplifier, it is possible to simplify a circuit configuration for stopping current supply to an amplifier which is not necessary for operation.

Next, an amplifier circuit to be used for an RF module according to an embodiment of the present invention will be described. FIG. 7 shows a configuration of the amplifier circuit. The present circuit is to add, to a signal amplifying transistor Tr, an active current stabilizing circuit which operates to keep constant the collector voltage Vc of the signal amplifying transistor Tr, and which is here a constant voltage circuit 10, so as to keep constant the current flowing through a load resistance RL. IN is a signal input terminal, and OUT is a signal output terminal. In the case of this circuit configuration, the variation of current consumption is determined by voltage Vcc applied from outside, and by the accuracy of the voltage Vc of the constant voltage circuit as well as by the accuracy of the load resistance RL, regardless of the current amplification factor hfe of the transistor Tr.

FIG. 8 shows a specific configuration of the constant voltage circuit 10 in the amplifier circuit. The configuration and the operation principle of the constant voltage circuit 10 will be described. Voltage Vc can be expressed as Vc=V'ref+VBE1, where the base voltage of a transistor Tr1 is assumed to be reference voltage V'ref. Further, V'ref which is the base voltage of the transistor Tr1 can be expressed as Vref−VBE2, where Vref is the base voltage of a transistor Tr2. Assuming here that the transistors Tr1 and Tr2 are a transistor unit of two integrated transistors with VBE1 being infinitely close to VBE2:

$$Vc=V'ref+VBE1=Vref-VBE2+VBE1=Vref$$

Vref is determined by the accuracies of the resistances R1 and R2.

For this reason, if the resistance values of the resistances RL and R1, R2 are set as highly accurate ones (generally, variations are small), this constant voltage circuit 10 operates to allow the collector voltage Vc of the signal amplifying transistor Tr to be the reference voltage Vref. Thus, the current (IC+IB) flowing through the resistance RL becomes substantially constant, and as a result, the current of the transistor of the amplifier can be set at a required minimum, making it possible to prevent the power consumption from unnecessarily increasing due to the variations, and further to reduce a maximum power consumption value as compared with a conventional circuit.

Specifically, assume that the resistance values of the resistances RL and R1, R2 are set as highly accurate ones, such as 1% accuracy product. The current consumption becomes maximum when the resistance R1 is 101% and the resistance R2 is 99% with the resistance RL being 99%. In this case, as compared with resistance values exactly meeting the standard, the current consumption increases by only 2.02%. Furthermore, the present invention enables to obtain the above-described operation and effect in a discrete circuit configuration with high design freedom.

Third Embodiment

FIG. 9 shows a block configuration of an RF module according to Third Embodiment of the present invention. The present Embodiment is basically similar in configuration to, but is partially different in configuration and function from, the First Embodiment shown in FIG. 1 described above. More specifically, according to the RF module 101 of the First Embodiment, the respective branching units 13, 23 and the relay switches 16, 26 are disposed at the outputs of the amplifiers 12, 22 respectively inserted in the two lines, in which the respective branch lines cross and are connected to the respective others. In contrast, according to the RF module 102 of the Third Embodiment, a respective one branching unit 13 and a respective one relay switch 26 are disposed at an input of a first amplifier 12 inserted in one line and at an input of a second amplifier 22 inserted in the other line, respectively, in which only one branch line 15 is connected to the other line. Note that this RF module 102 has a branching unit 230 which is disposed in the output line of the second amplifier 22, and which forms second and third output lines 271, 272. Tuners 52, 53 are connected to output terminals OUTPUT 2 and OUTPUT 3 of these lines.

FIG. 10 shows a circuit of the same RF module according to the Third Embodiment. The branching unit 13 is disposed in a first line 11 at an input of a first amplifier 12. A relay switch 26 is disposed in a line at an input of a second amplifier 22, and has relay switch contacts (NC, NO), to which a branch line 15 by the branching unit 13 and a second input line 21 on the other are respectively connected, and further has a relay common contact. This common contact is connected to the line at the input of the second amplifier 22.

Power supply applied to a power supply terminal 30C is continuously provided to the first amplifier 12 through a power supply line 32, while the power supply is controlled and provided to the second amplifier 22 by way of a standby circuit 302 which is an electronic switch provided in the power supply line 32. The standby circuit 302 is operated to be turned on and off in response to a signal provided to a standby signal terminal 30B. Provided to the standby signal terminal 30B is such a signal that closes the standby circuit 302 (provides power supply) when the power supply switch of a television is turned ON, and that opens the standby circuit 302 (stops power supply) during standby in the other time. These configurations including the standby circuit 302 form a power supply control means for controlling the power supply to the amplifier.

The relay switch 26 is switched and controlled by a relay drive circuit 301 which is an electronic switch. The relay drive circuit 301 is controlled in response to an input signal to a control signal terminal 30A through a relay control signal line 31. A signal based on an operation command of a user is input to the control signal terminal 30A. Normally, the relay switch 26 connects, by way of the NC contact, the branch line 15 from the first input line 11 to the line in which the second amplifier 22 is inserted. When an operation command signal of the user is provided to the control signal terminal 30A here, the relay drive circuit 301 operates to cause the relay switch 26 to switch to the NO contact, and connect the second input line 21 to the line in which the second amplifier 22 is inserted. Thus, the user can optionally change content to be output to second and third output lines 271, 272.

The RF module 102 according to the present Embodiment as configured above can continuously provide power supply to the first amplifier 12, and can provide power supply to the second amplifier 22 only when necessary while stopping the power supply thereto during standby. This makes it possible to reduce power consumption of the RF module 102. Further, power supply is continuously provided to the first amplifier 12, so that when a CATV signal is input to the first input line 11, it is possible to output character information contained in the out-of-band region of CATV to the first output line 17 even during standby.

The present invention is not limited to the above Embodiments, and various modifications are possible. For example, the inductance for providing power supply can be, instead of the series inductance, an element such as a ferrite piece to become almost a resistance component in high frequency, and is a concept including such one. Further, optional forms can be employed for the configuration of the current stabilizing circuit and its power supply configuration.

INDUSTRIAL APPLICABILITY

The present invention is used for an RF switch module which switches and outputs multiple line input signals of e.g. CATV and terrestrial TV to specified output terminals.

Figure 1:
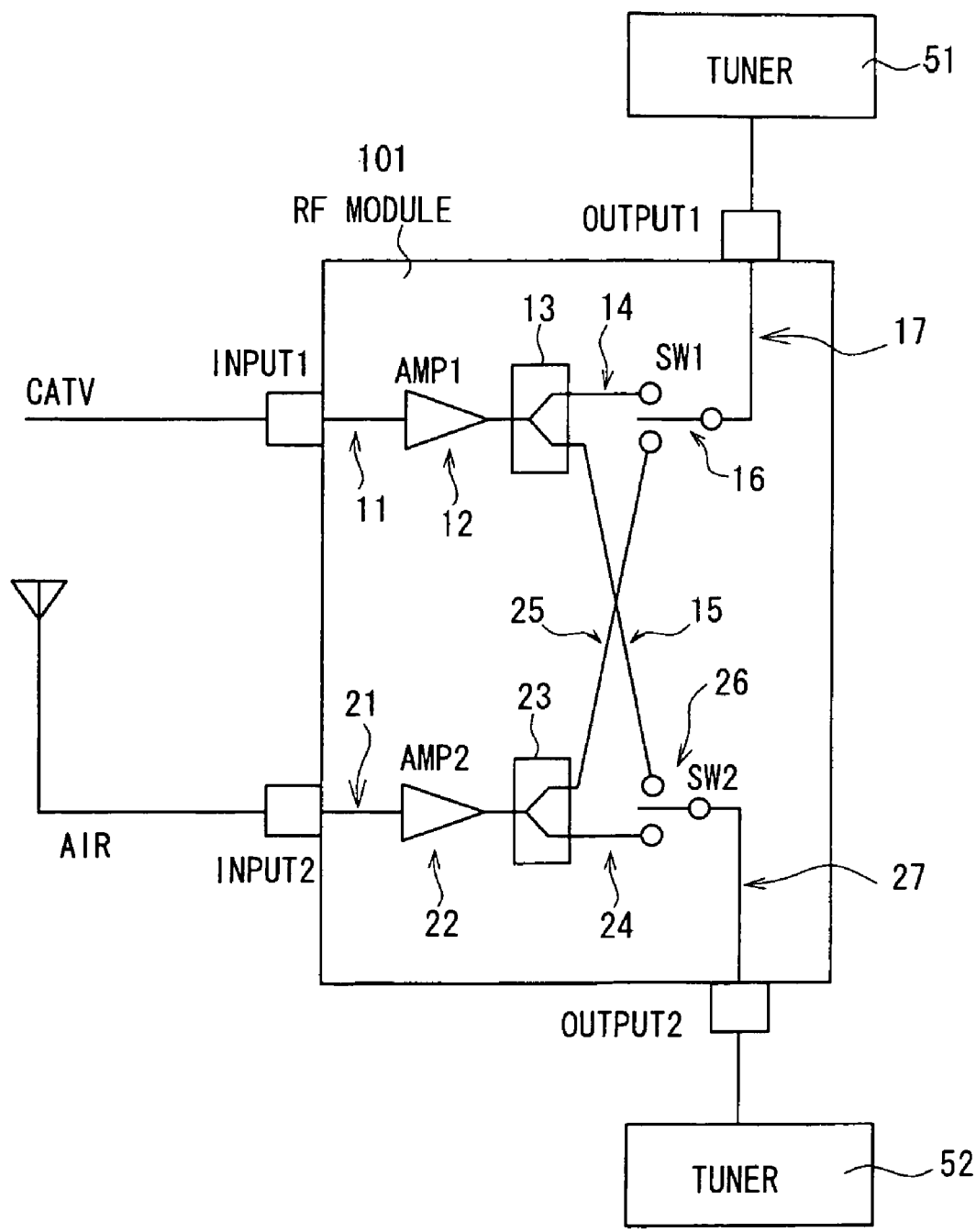
FIG. 1 is a block diagram of an RF module according to First Embodiment of the present invention.
Figure 2:
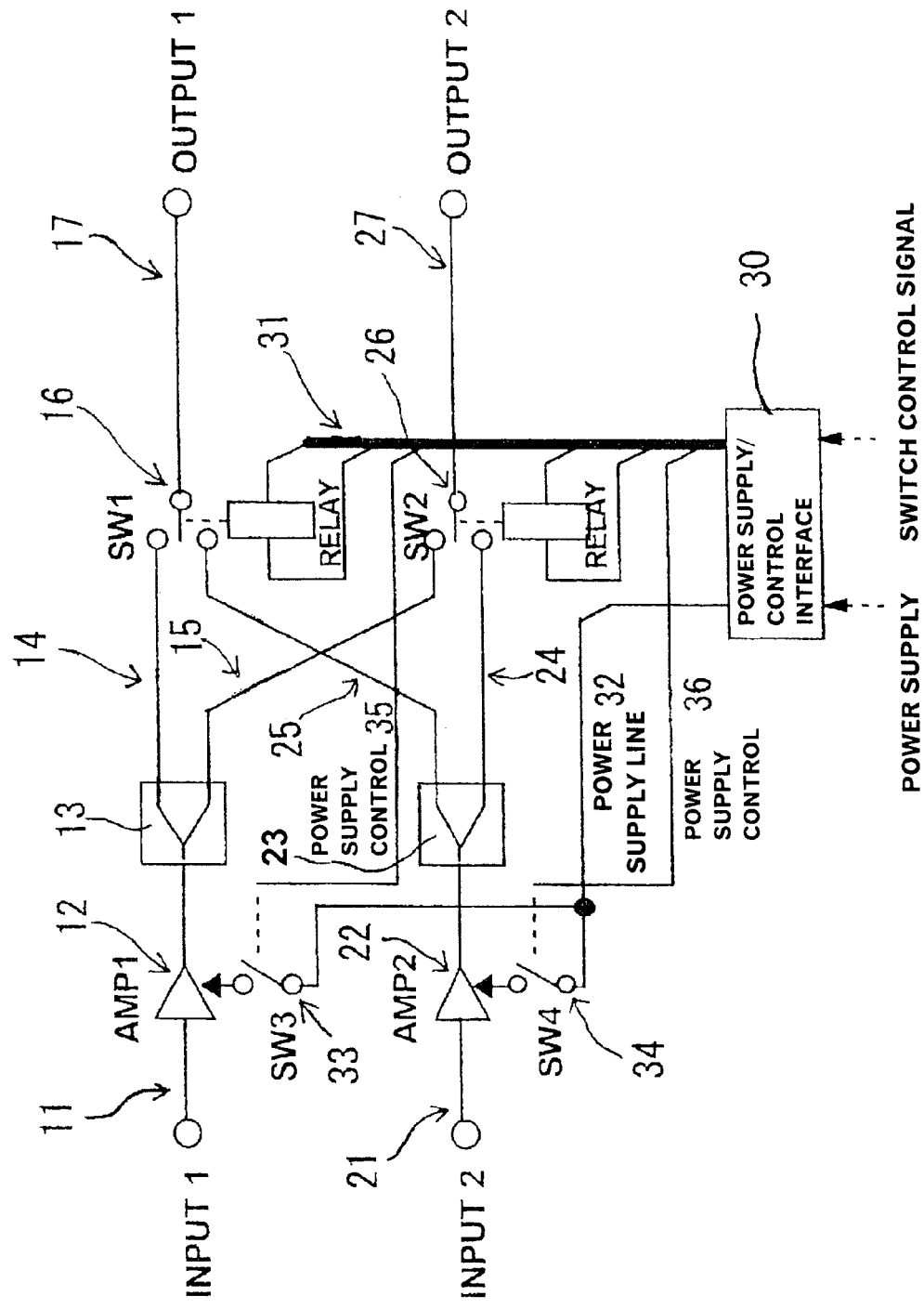
FIG. 2 is a circuit diagram of the same RF module.
Figure 3:
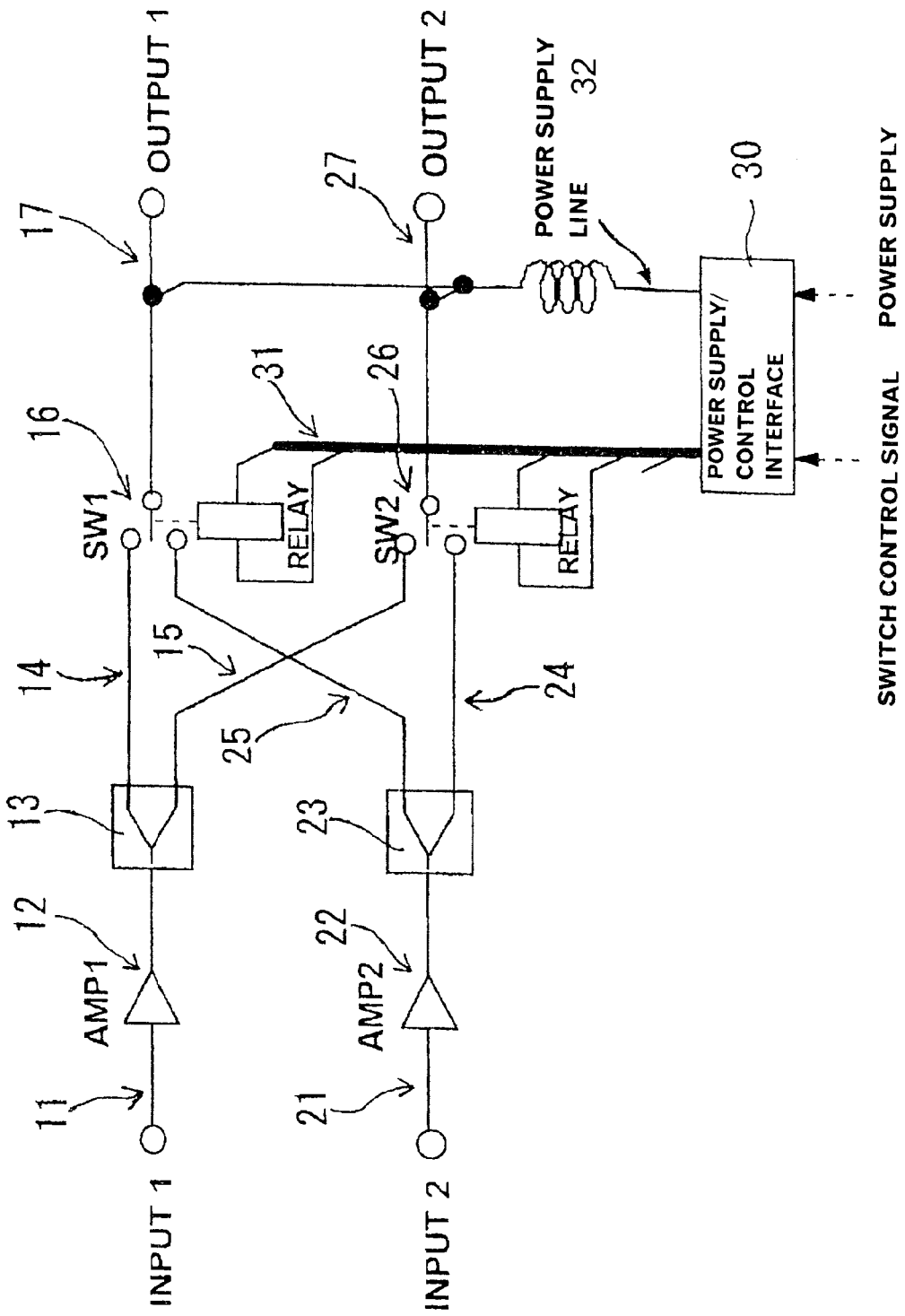
FIG. 3 is a circuit diagram of an RF module according to Second Embodiment of the present invention.
Figure 4:
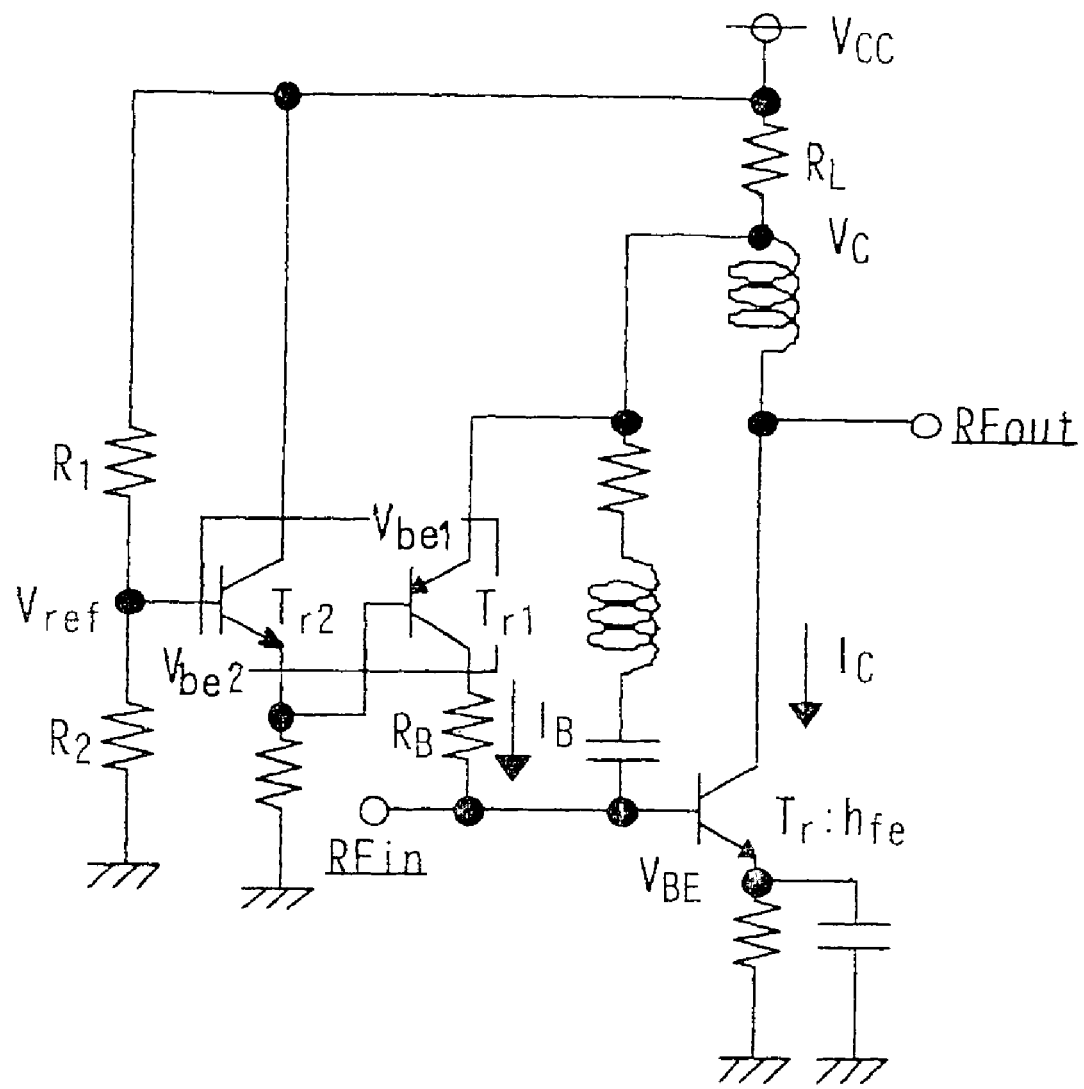
FIG. 4 is a diagram showing one example of circuit of amplifier used in the First and Second Embodiments.
Figure 5:
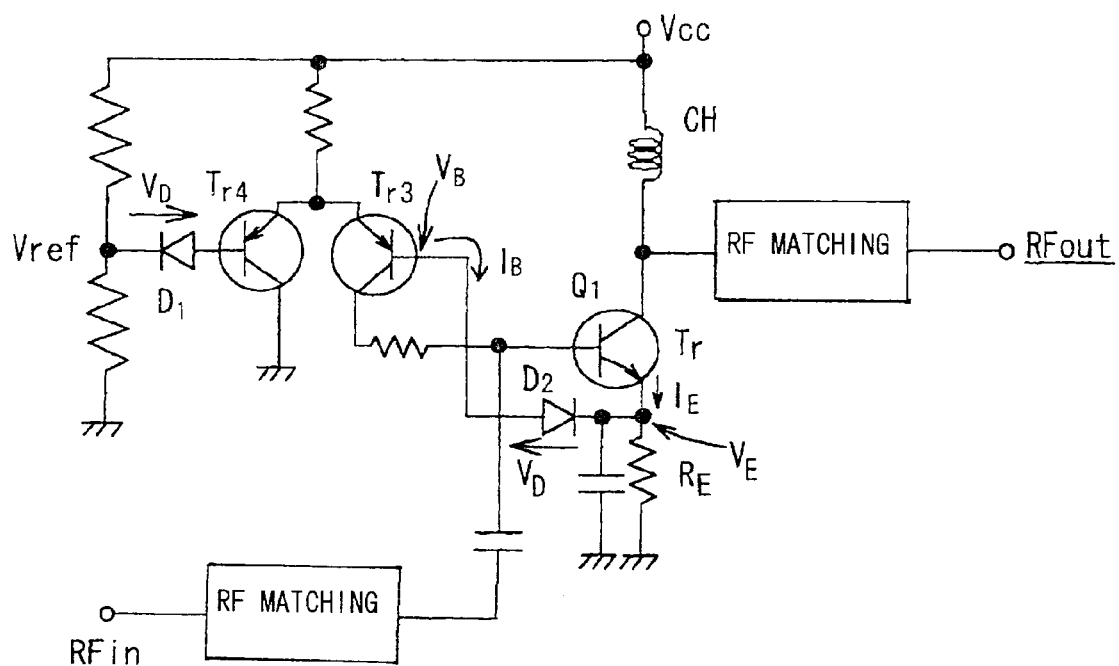
FIG. 5 is a diagram showing another example of circuit of amplifier.
Figure 6:
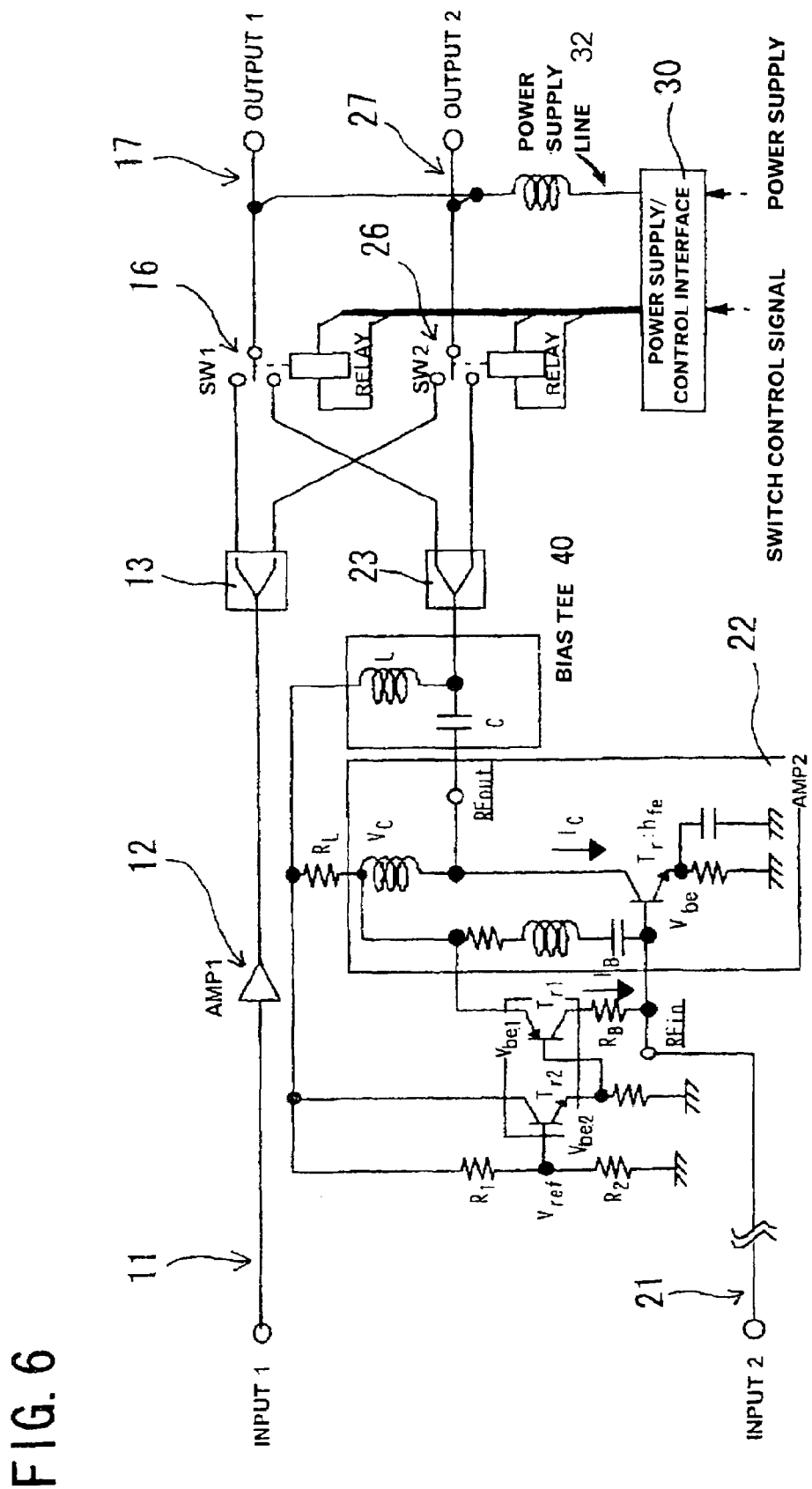
FIG. 6 is a circuit diagram of the Embodiment of FIG. 3 having an amplifier circuit of FIG. 4 specifically disposed therein.
Figure 7:
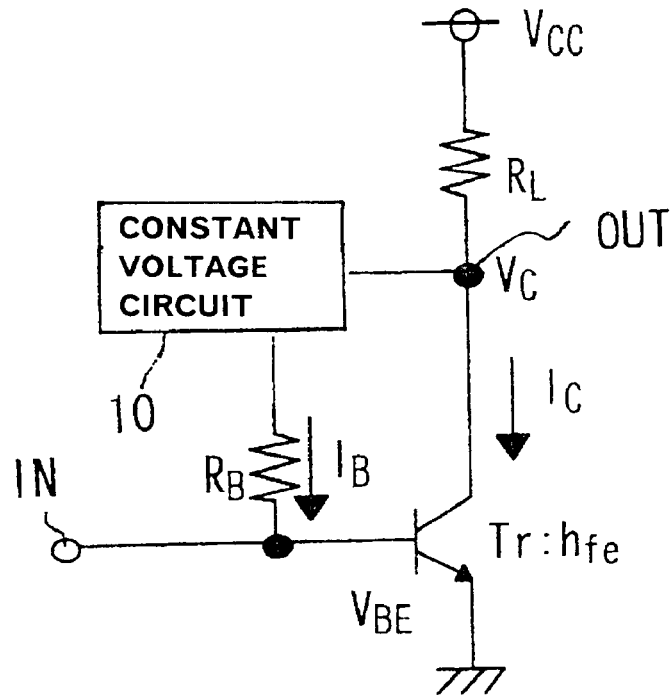
FIG. 7 is a circuit diagram of an amplifier in an RF module according to Embodiment of the present invention.
Figure 8:
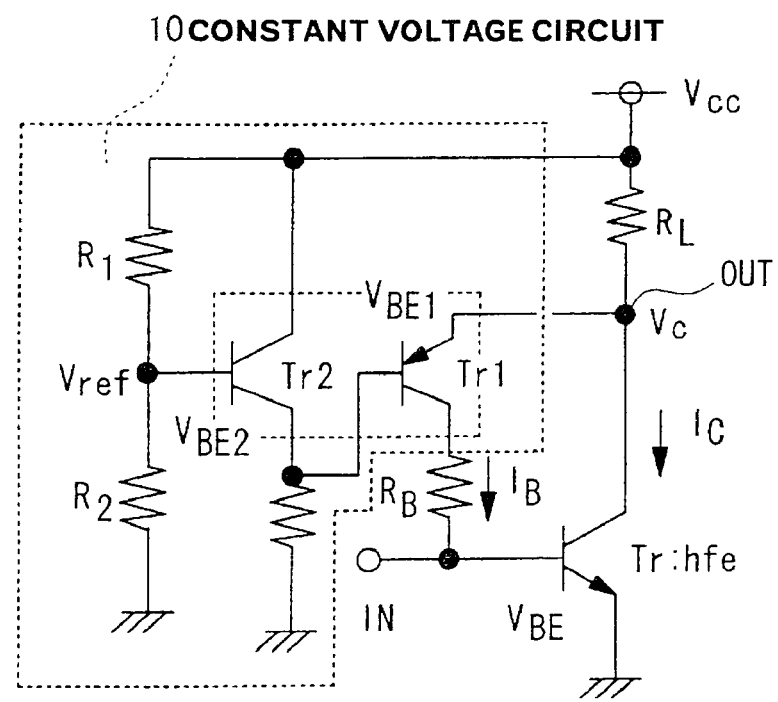
FIG. 8 is a circuit diagram showing an example of the same amplifier.
Figure 9:
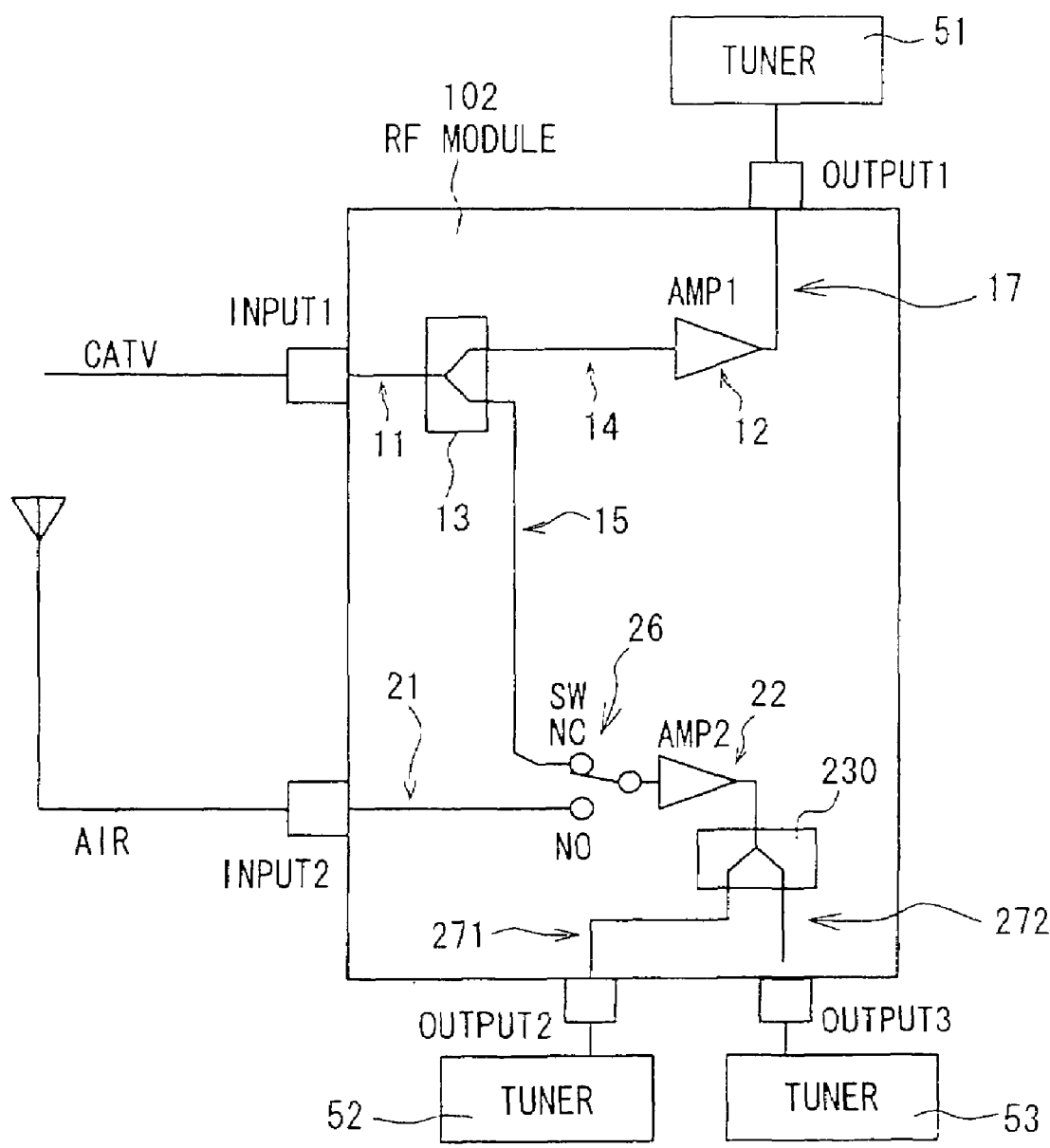
FIG. 9 is a block diagram of an RF module according to Third Embodiment of the present invention.
Figure 10:
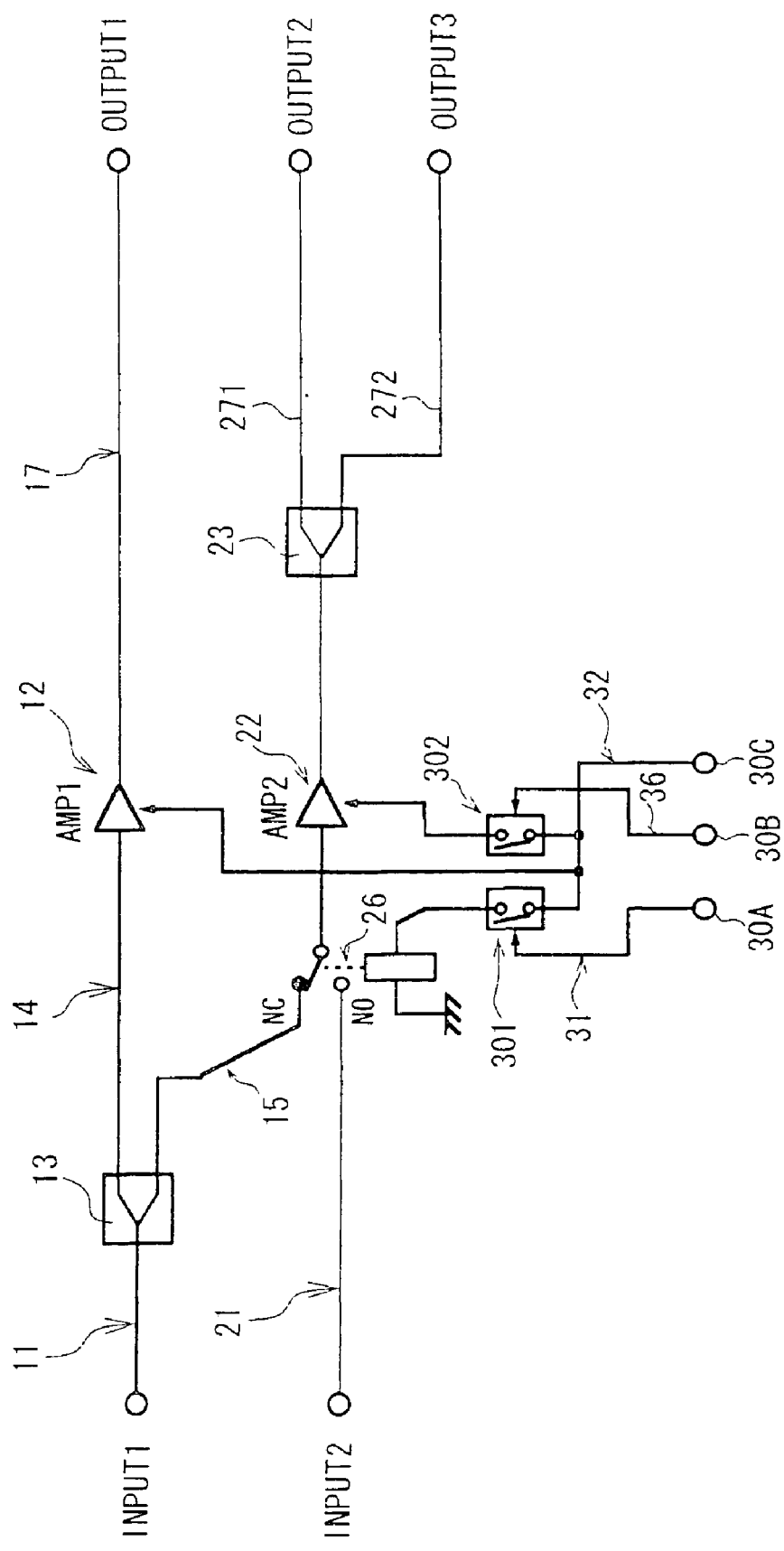
FIG. 10 is a circuit diagram of the same RF module.
Figure 11:
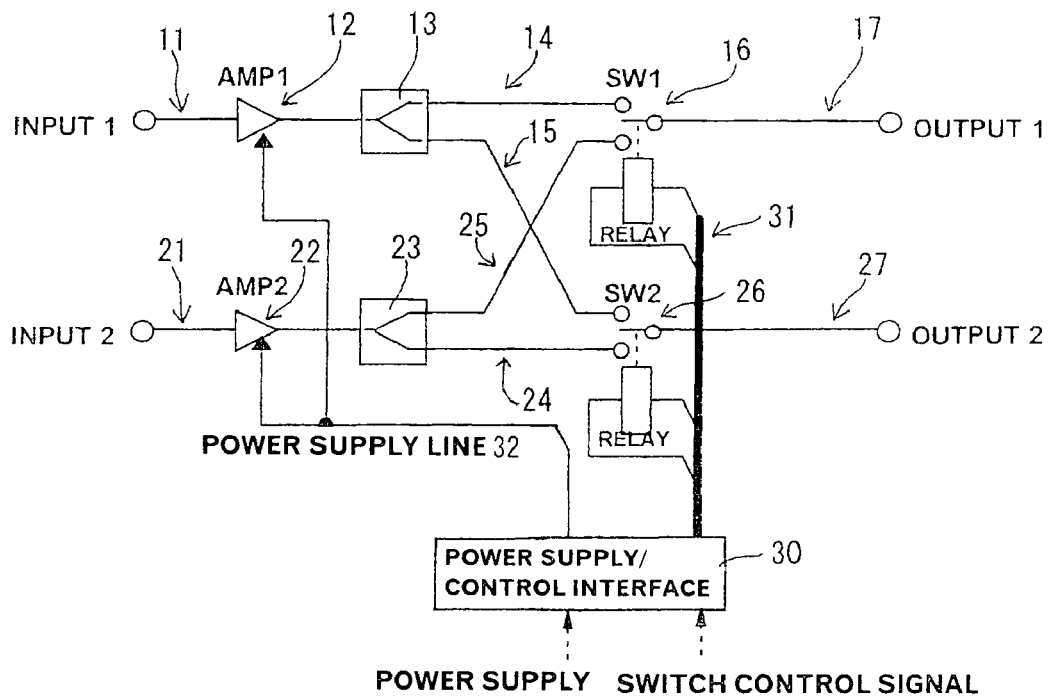
FIG. 11 is a configuration diagram of a conventional RF module.
Figure 12:
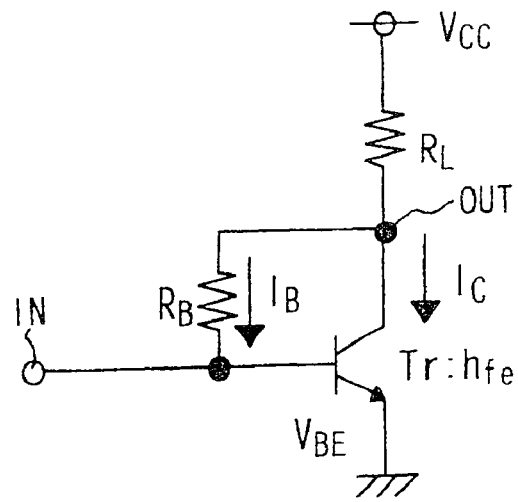
FIG. 12 is a circuit diagram of an amplifier in the conventional RF module.

The invention claimed is:

1. A television switch module that switches output lines of television high frequency signals, comprising:
   first and second input lines that respectively input television high frequency signals;
   first and second output lines that output signals which are after being amplified;
   first and second amplifiers inserted in the respective input lines for respectively amplifying input signals;
   a brancher disposed in at least one line at an input or an output of the first or the second amplifier for branching the input line;
   a relay switch disposed in a further line different from the one line with the brancher that switches either to the one line with the brancher or to the further line branched by the brancher;
   a relay switch controller that switches the relay switch based on an operation from outside; and
   a power supply controller that controls a power supply to the respective amplifiers, and stops the power supply to an amplifier inserted in an unused input line, wherein the brancher is disposed at each of the outputs of the first and second amplifiers inserted in the respective input lines to form two units, the relay switch is disposed in each of the lines to form a first relay switch and a second relay switch, and each of the relay switches has relay switch contacts, to which one branch line by the brancher disposed in one line and one branch line by the brancher disposed in the other line are respectively connected, and also has a relay common contact, the common contact being connected to each of the output lines, the power supply to the first and second amplifiers being provided from the output lines by way of the contacts of the relay switches, and an active current stabilizer being added to an amplifier output transistor of the amplifier, wherein the amplifier comprises:
   a grounded-emitter signal amplifying transistor having a base, to which a signal is input, and a collector connected to a power supply Vcc through a load resistance, the collector being a signal output terminal; and
   the current stabilizer is added between the collector and the base of the transistor, to keep constant a current flowing through the load resistance so as to keep constant a collector voltage Vc of the transistor, and wherein the current stabilizer is formed of a unit of at least two transistors, and has a configuration which works to cause a reference voltage for the current stabilizer, as obtained by a resistance voltage division of the power supply Vcc, to be equal to the collector voltage Vc of the signal amplifying transistor.

2. The television switch module according to claim 1, wherein:
   the power supply to the first and second amplifiers is provided through a power supply line; and
   the power supply controller comprises a power supply switch that turns the power supply line on and off, and a power supply control signal line that transfers an on/off control signal to control and turn the power supply switch on and off.

3. The television switch module according to claim 1, wherein the power supply to the amplifier is provided by way of an inductance from a line through which a high frequency signal flows.

4. A television switch module that switches output lines of television high frequency signals, comprising:
   first and second input lines that respectively input television high frequency signals;
   first and second amplifiers inserted in the respective input lines for respectively amplifying input signals;
   first and second output lines that output signals after being amplified;
   a brancher disposed in at least one line at an input or an output of the first or the second amplifier for branching the input line;
   a relay switch disposed in a further line different from the one line with the brancher that switches either to the one line with the brancher or to the further line branched by the brancher;
   a relay switch controller that switches the relay switch based on an operation from outside; and
   a power supply controller that controls a power supply to the respective first and second amplifiers, and stops the power supply to an amplifier inserted in an unused input line, wherein:
   the brancher is formed of one unit disposed in the line at the input of the first amplifier;
   the relay switch is formed of one switch disposed in the line at the input of the second amplifier, and has relay switch contacts, to which one branch line by the brancher and the other line are respectively connected, and also has a relay common contact, in which this common contact is connected to the line at the input of the second amplifier;
   the power supply controller continuously provides the power supply to the first amplifier while providing the power supply to the second amplifier by way of a standby circuit; and the standby circuit provides the power supply to the second amplifier when a power supply switch of a television is turned ON, and stops the power supply during standby in the other time.

5. The television switch module according to claim 4, wherein when a television signal containing character information in its out-of-band region is input to the first input line, the output line of the first amplifier can output the character information even during standby.

* * * * *